US010620618B2

(12) United States Patent
Poh et al.

(10) Patent No.: US 10,620,618 B2
(45) Date of Patent: Apr. 14, 2020

(54) SYSTEMS AND METHODS FOR DETERMINING RELATIONSHIPS BETWEEN DEFECTS

(71) Applicant: Palantir Technologies Inc., Palo Alto, CA (US)

(72) Inventors: Andrew Poh, San Francisco, CA (US); Andre Frederico Cavalheiro Menck, New York, NY (US); Arion Sprague, San Francisco, CA (US); Benjamin Grabham, London (GB); Benjamin Lee, London (GB); Bianca Rahill-Marier, New York, NY (US); Gregoire Omont, London (GB); Jim Inoue, Kirkland, WA (US); Jonah Scheinerman, Ann Arbor, MI (US); Maciej Albin, London (GB); Myles Scolnick, Englewood, CO (US); Paul Gribelyuk, Jersey City, NJ (US); Steven Fackler, Menlo Park, CA (US); Tam-Sanh Nguyen, Olney, MD (US); Thomas Powell, London (GB); William Seaton, New York, NY (US)

(73) Assignee: Palantir Technologies Inc., Palo Alto, CA (US)

(*) Notice: Subject to any disclaimer, the term of this patent is extended or adjusted under 35 U.S.C. 154(b) by 0 days.

(21) Appl. No.: 15/385,664

(22) Filed: Dec. 20, 2016

(65) Prior Publication Data
US 2018/0173212 A1 Jun. 21, 2018

(51) Int. Cl.
G05B 23/02 (2006.01)
G06N 99/00 (2019.01)
(Continued)

(52) U.S. Cl.
CPC ......... *G05B 23/0235* (2013.01); *G06N 20/00* (2019.01); *G06Q 10/06395* (2013.01)

(58) Field of Classification Search
None
See application file for complete search history.

(56) References Cited

U.S. PATENT DOCUMENTS 5,801,965 A * 9/1998 Takagi .................. G01N 21/94
356/237.1
5,905,650 A * 5/1999 Tsutsui ............. G01R 31/31935
700/109

(Continued)

FOREIGN PATENT DOCUMENTS

EP 1191463 3/2002
EP 2555153 2/2013
(Continued)

OTHER PUBLICATIONS

US 8,712,906 B1, 04/2014, Sprague et al. (withdrawn)
(Continued)

*Primary Examiner* — Janet L Suglo
*Assistant Examiner* — Leonard S Liang
(74) *Attorney, Agent, or Firm* — Sheppard Mullin Richter & Hampton LLP

(57) ABSTRACT

Systems and methods are provided for identifying relationships between defects. The system may obtain defect items and associated information. Defect items may be compared to one another based on their attributes to determine how related they are. According to the comparisons, defect items may be grouped together into issue items for further analysis by a user. The system may further update a defect comparison model according to user interaction with defect items.

17 Claims, 5 Drawing Sheets

(51) Int. Cl.
  *G06N 20/00* (2019.01)
  *G06Q 10/06* (2012.01)

(56) References Cited

U.S. PATENT DOCUMENTS

| | | | |
|---|---|---|---|
| 6,246,787 B1 * | 6/2001 | Hennessey | G01N 21/95607 250/559.45 |
| 6,336,082 B1 * | 1/2002 | Nguyen | G06K 9/6255 340/658 |
| 6,374,251 B1 | 4/2002 | Fayyad et al. | |
| 6,567,936 B1 | 5/2003 | Yang et al. | |
| 6,775,675 B1 | 8/2004 | Nwabueze et al. | |
| 6,779,159 B2 * | 8/2004 | Yokoyama | G01N 21/9501 382/145 |
| 6,980,984 B1 | 12/2005 | Huffman et al. | |
| 7,373,669 B2 | 5/2008 | Eisen | |
| 7,451,397 B2 | 11/2008 | Weber et al. | |
| 7,574,409 B2 | 8/2009 | Patinkin | |
| 7,596,285 B2 | 9/2009 | Brown et al. | |
| 7,783,658 B1 | 8/2010 | Bayliss | |
| 7,805,457 B1 | 9/2010 | Viola et al. | |
| 7,814,102 B2 | 10/2010 | Miller et al. | |
| 8,046,362 B2 | 10/2011 | Bayliss | |
| 8,135,679 B2 | 3/2012 | Bayliss | |
| 8,135,719 B2 | 3/2012 | Bayliss | |
| 8,266,168 B2 | 9/2012 | Bayliss | |
| 8,301,904 B1 | 10/2012 | Gryaznov | |
| 8,312,546 B2 | 11/2012 | Alme | |
| 8,321,943 B1 | 11/2012 | Walters et al. | |
| 8,347,398 B1 | 1/2013 | Weber | |
| 8,447,674 B2 | 5/2013 | Choudhuri et al. | |
| 8,484,168 B2 | 7/2013 | Bayliss | |
| 8,495,077 B2 | 7/2013 | Bayliss | |
| 8,498,969 B2 | 7/2013 | Bayliss | |
| 8,554,653 B2 | 10/2013 | Falkenborg et al. | |
| 8,560,413 B1 | 10/2013 | Quarterman | |
| 8,600,872 B1 | 12/2013 | Yan | |
| 8,682,812 B1 | 3/2014 | Ranjan | |
| 8,726,379 B1 | 5/2014 | Stiansen et al. | |
| 8,788,405 B1 | 7/2014 | Sprague et al. | |
| 8,788,407 B1 | 7/2014 | Singh et al. | |
| 8,818,892 B1 | 8/2014 | Sprague et al. | |
| 9,009,827 B1 | 4/2015 | Albertson et al. | |
| 9,020,943 B2 * | 4/2015 | Caldwell | G06F 16/285 707/737 |
| 9,043,894 B1 | 5/2015 | Dennison et al. | |
| 9,135,658 B2 | 9/2015 | Sprague et al. | |
| 9,165,299 B1 | 10/2015 | Stowe et al. | |
| 9,171,334 B1 | 10/2015 | Visbal et al. | |
| 9,177,344 B1 | 11/2015 | Singh et al. | |
| 9,202,249 B1 | 12/2015 | Cohen et al. | |
| 9,230,280 B1 | 1/2016 | Maag et al. | |
| 9,256,664 B2 | 2/2016 | Chakerian et al. | |
| 9,344,447 B2 | 5/2016 | Cohen et al. | |
| 9,367,872 B1 | 6/2016 | Visbal et al. | |
| 2001/0020194 A1 * | 9/2001 | Takagi | G01N 21/94 700/109 |
| 2002/0161532 A1 * | 10/2002 | Dor | H01L 22/20 702/35 |
| 2002/0181756 A1 * | 12/2002 | Shibuya | G01N 21/956 382/145 |
| 2002/0194119 A1 | 12/2002 | Wright et al. | |
| 2003/0033228 A1 | 2/2003 | Bosworth-Davies et al. | |
| 2003/0074368 A1 | 4/2003 | Schuetze et al. | |
| 2003/0097330 A1 | 5/2003 | Hillmer et al. | |
| 2003/0154044 A1 | 8/2003 | Lundstedt et al. | |
| 2004/0044484 A1 * | 3/2004 | Obara | H01L 21/67253 702/35 |
| 2004/0064269 A1 * | 4/2004 | Shibuya | G06T 7/0004 702/40 |
| 2004/0158409 A1 * | 8/2004 | Teshima | H01J 37/28 702/22 |
| 2004/0205524 A1 | 10/2004 | Richter et al. | |
| 2004/0218806 A1 * | 11/2004 | Miyamoto | G06K 9/6253 382/145 |
| 2005/0097482 A1 * | 5/2005 | Hanson | G01N 21/95684 716/56 |
| 2005/0108063 A1 | 5/2005 | Madill et al. | |
| 2005/0222928 A1 | 10/2005 | Steier et al. | |
| 2005/0271261 A1 * | 12/2005 | Onishi | G06T 7/001 382/149 |
| 2006/0095521 A1 | 5/2006 | Patinkin | |
| 2006/0218637 A1 | 9/2006 | Thomas et al. | |
| 2007/0031982 A1 * | 2/2007 | Lim | G01N 21/94 438/14 |
| 2007/0047801 A1 * | 3/2007 | Kojima | G06T 7/0004 382/149 |
| 2007/0106582 A1 | 5/2007 | Baker et al. | |
| 2007/0192265 A1 | 8/2007 | Chopin et al. | |
| 2007/0294200 A1 | 12/2007 | Au | |
| 2008/0015802 A1 * | 1/2008 | Urano | G01N 21/4738 702/81 |
| 2008/0133567 A1 | 6/2008 | Ames et al. | |
| 2008/0148398 A1 | 6/2008 | Mezack et al. | |
| 2008/0175466 A1 * | 7/2008 | Ishikawa | G06T 7/001 382/141 |
| 2008/0288425 A1 | 11/2008 | Posse et al. | |
| 2009/0018940 A1 | 1/2009 | Wang et al. | |
| 2009/0024505 A1 | 1/2009 | Patel et al. | |
| 2009/0044279 A1 | 2/2009 | Crawford et al. | |
| 2009/0082997 A1 | 3/2009 | Tokman et al. | |
| 2009/0083184 A1 | 3/2009 | Eisen | |
| 2009/0153673 A1 * | 6/2009 | Chu | G06T 15/00 348/207.1 |
| 2009/0172821 A1 | 7/2009 | Daira et al. | |
| 2009/0192957 A1 | 7/2009 | Subramanian et al. | |
| 2009/0254970 A1 | 10/2009 | Agarwal et al. | |
| 2009/0254971 A1 | 10/2009 | Herz | |
| 2009/0271359 A1 | 10/2009 | Bayliss | |
| 2009/0300589 A1 | 12/2009 | Watters et al. | |
| 2009/0318775 A1 | 12/2009 | Michelson et al. | |
| 2010/0077481 A1 | 3/2010 | Polyakov et al. | |
| 2010/0077483 A1 | 3/2010 | Stolfo et al. | |
| 2010/0100963 A1 | 4/2010 | Mahaffey | |
| 2010/0106611 A1 | 4/2010 | Paulsen et al. | |
| 2010/0125546 A1 | 5/2010 | Barrett et al. | |
| 2010/0169237 A1 | 7/2010 | Howard et al. | |
| 2010/0185691 A1 | 7/2010 | Irmak et al. | |
| 2010/0306029 A1 | 12/2010 | Jolley | |
| 2010/0330801 A1 | 12/2010 | Rouh | |
| 2011/0055140 A1 | 3/2011 | Roychowdhury | |
| 2011/0087519 A1 | 4/2011 | Fordyce, III et al. | |
| 2011/0093327 A1 | 4/2011 | Fordyce, III et al. | |
| 2011/0131122 A1 | 6/2011 | Griffin et al. | |
| 2011/0167054 A1 | 7/2011 | Bailey et al. | |
| 2011/0167493 A1 | 7/2011 | Song et al. | |
| 2011/0173093 A1 | 7/2011 | Psota et al. | |
| 2011/0178842 A1 | 7/2011 | Rane et al. | |
| 2011/0219450 A1 | 9/2011 | McDougal et al. | |
| 2011/0225650 A1 | 9/2011 | Margolies et al. | |
| 2011/0231223 A1 | 9/2011 | Winters | |
| 2011/0238510 A1 | 9/2011 | Rowen et al. | |
| 2011/0238553 A1 | 9/2011 | Raj et al. | |
| 2011/0238570 A1 | 9/2011 | Li et al. | |
| 2011/0246229 A1 | 10/2011 | Pacha | |
| 2011/0251951 A1 | 10/2011 | Kolkowitz | |
| 2011/0307382 A1 | 12/2011 | Siegel et al. | |
| 2011/0314546 A1 | 12/2011 | Aziz et al. | |
| 2012/0004904 A1 | 1/2012 | Shin et al. | |
| 2012/0084135 A1 | 4/2012 | Nissan et al. | |
| 2012/0084866 A1 | 4/2012 | Stolfo | |
| 2012/0131107 A1 | 5/2012 | Yost | |
| 2012/0155740 A1 * | 6/2012 | Cho | G06T 7/001 382/149 |
| 2012/0158626 A1 | 6/2012 | Zhu et al. | |
| 2012/0215898 A1 | 8/2012 | Shah et al. | |
| 2012/0254129 A1 | 10/2012 | Wheeler et al. | |
| 2012/0310831 A1 | 12/2012 | Harris et al. | |
| 2012/0310838 A1 | 12/2012 | Harris et al. | |
| 2012/0311684 A1 | 12/2012 | Paulsen et al. | |
| 2013/0006426 A1 | 1/2013 | Healey et al. | |
| 2013/0006655 A1 | 1/2013 | Van Arkel et al. | |
| 2013/0006668 A1 | 1/2013 | Van Arkel et al. | |

(56) References Cited

U.S. PATENT DOCUMENTS

| | | | |
|---|---|---|---|
| 2013/0018796 A1 | 1/2013 | Kolhatkar et al. | |
| 2013/0024307 A1 | 1/2013 | Fuerstenberg et al. | |
| 2013/0024339 A1 | 1/2013 | Choudhuri et al. | |
| 2013/0101221 A1* | 4/2013 | Fujiki | G06K 9/6284 382/195 |
| 2013/0151388 A1 | 6/2013 | Falkenborg et al. | |
| 2013/0160120 A1 | 6/2013 | Malaviya et al. | |
| 2013/0166550 A1 | 6/2013 | Buchmann et al. | |
| 2013/0185320 A1 | 7/2013 | Iwasaki et al. | |
| 2013/0197925 A1 | 8/2013 | Blue | |
| 2013/0211985 A1 | 8/2013 | Clark et al. | |
| 2013/0232045 A1 | 9/2013 | Tai et al. | |
| 2013/0276799 A1 | 10/2013 | Davidson | |
| 2013/0318594 A1 | 11/2013 | Hoy et al. | |
| 2013/0339218 A1 | 12/2013 | Subramanian et al. | |
| 2013/0339514 A1 | 12/2013 | Crank et al. | |
| 2014/0006109 A1 | 1/2014 | Callioni et al. | |
| 2014/0032506 A1 | 1/2014 | Hoey et al. | |
| 2014/0037188 A1* | 2/2014 | Nakagaki | G06T 7/0006 382/149 |
| 2014/0056507 A1* | 2/2014 | Doyle | G01B 11/002 382/152 |
| 2014/0058763 A1 | 2/2014 | Zizzamia et al. | |
| 2014/0081652 A1 | 3/2014 | Klindworth | |
| 2014/0097934 A1* | 4/2014 | Su | G08C 17/02 340/3.1 |
| 2014/0129261 A1 | 5/2014 | Bothwell et al. | |
| 2014/0149130 A1 | 5/2014 | Getchius | |
| 2014/0149272 A1 | 5/2014 | Hirani et al. | |
| 2014/0149436 A1 | 5/2014 | Bahrami et al. | |
| 2014/0156484 A1 | 6/2014 | Chan et al. | |
| 2014/0244644 A1* | 8/2014 | Mashinchi | G06Q 50/22 707/737 |
| 2014/0283067 A1 | 9/2014 | Call et al. | |
| 2014/0310282 A1 | 10/2014 | Sprague et al. | |
| 2014/0331119 A1 | 11/2014 | Dixon et al. | |
| 2014/0379812 A1 | 12/2014 | Bastide et al. | |
| 2015/0026159 A1* | 1/2015 | Berkman | G06F 16/9535 707/722 |
| 2015/0067533 A1 | 3/2015 | Volach | |
| 2015/0178825 A1 | 6/2015 | Huerta | |
| 2015/0235334 A1 | 8/2015 | Wang et al. | |
| 2015/0248318 A1* | 9/2015 | Farinacci | G06F 11/3692 714/37 |
| 2015/0294052 A1* | 10/2015 | Urmanov | G06F 17/18 703/2 |
| 2016/0004764 A1 | 1/2016 | Chakerian et al. | |
| 2016/0034470 A1 | 2/2016 | Sprague et al. | |
| 2016/0048937 A1 | 2/2016 | Mathura et al. | |
| 2016/0092791 A1* | 3/2016 | Moghaddam | G06Q 30/0282 706/12 |
| 2016/0180451 A1 | 6/2016 | Visbal et al. | |
| 2016/0253679 A1* | 9/2016 | Venkatraman | G06Q 30/0185 705/310 |
| 2016/0283862 A1* | 9/2016 | Urmanov | G06N 99/005 |
| 2017/0060995 A1* | 3/2017 | Boule | G06F 16/3344 |
| 2017/0192880 A1* | 7/2017 | Ramakrishnan | G06F 11/3672 |
| 2017/0277583 A1* | 9/2017 | Mohandoss | G06F 11/0778 |
| 2018/0129549 A1* | 5/2018 | Fredericks | G06K 9/00523 |

FOREIGN PATENT DOCUMENTS

| | | | |
|---|---|---|---|
| EP | 2911078 | 8/2015 | |
| EP | 2963577 | 1/2016 | |
| EP | 2985729 | 2/2016 | |
| EP | 3018879 | 5/2016 | |
| EP | 3037991 | 6/2016 | |
| EP | 3038046 | 6/2016 | |
| GB | 2513247 | 10/2014 | |
| WO | WO 2008/011728 | 1/2008 | |
| WO | WO 2008011728 A1 * | 1/2008 | G06F 17/30539 |
| WO | WO 2008/113059 | 9/2008 | |
| WO | WO 2009110795 A1 * | 9/2009 | G01N 21/88 |
| WO | WO 2013/126281 | 8/2013 | |

OTHER PUBLICATIONS

US 8,725,631 B1, 05/2014, Sprague et al. (withdrawn)
Wikipedia Entry for "Distance matrices in phylogeny" (https://en.wikipedia.org/wiki/Distance_matrices_in_phylogeny) (Snapshot taken using Wayback machine for Apr. 13, 2016) (https://web.archive.org/web/20160413051612/https://en.wikipedia.org/wiki/Distance_matrices_in_phylogeny) (Year: 2016).*
Official Communication for U.S. Appl. No. 14/278,963 dated Jan. 30, 2015.
Symantec Corporation, "E-Security Begins with Sound Security Policies," Announcement Symantec, Jun. 14, 2001.
Notice of Allowance for U.S. Appl. No. 14/473,860 dated Jan. 5, 2015.
Official Communication for European Patent Application No. 15155845.9 dated Oct. 6, 2015.
Official Communication for U.S. Appl. No. 14/518,757 dated Apr. 2, 2015.
Official Communication for U.S. Appl. No. 14/518,757 dated Jul. 20, 2015.
Official Communication for U.S. Appl. No. 14/518,757 dated Dec. 1, 2015.
Official Communication for European Patent Application No. 15156004.2 dated Aug. 24, 2015.
"A Word About Banks and the Laundering of Drug Money," Aug. 18, 2012, http://www.golemxiv.co.uk/2012/08/a-word-about-banks-and-the-laundering-of-drug-money/.
Alfred, Rayner "Summarizing Relational Data Using Semi-Supervised Genetic Algorithm-Based Clustering Techniques", Journal of Computer Science, 2010, vol. 6, No. 7, pp. 775-784.
"Money Laundering Risks and E-Gaming: A European Overview and Assessment," 2009, http://www.cf.ac.uk/socsi/resources/Levi_Final_Money_Laundering_Risks_egaming.pdf.
Nolan et al., "MCARTA: A Malicious Code Automated Run-Time Analysis Framework," Homeland Security (HST) 2012 IEEE Conference on Technologies for, Nov. 13, 2012, pp. 13-17.
Perdisci et al., "Behavioral Clustering of HTTP-Based Malware and Signature Generation Using Malicious Network Traces," USENIX, Mar. 18, 2010, pp. 1-14.
"Potential Money Laundering Warning Signs," snapshot taken 2003, https://web.archive.org/web/20030816090055/http:/finsolinc.com/ANTI-MONEY%20LAUNDERING%20TRAINING%20GUIDES.pdf.
Shah, Chintan, "Periodic Connections to Control Server Offer New Way to Detect Botnets," Oct. 24, 2013 in 6 pages, <http://www.blogs.mcafee.com/mcafee-labs/periodic-links-to-control-server-offer-new-way-to-detect-botnets>.
Shi et al., "A Scalable Implementation of Malware Detection Based on Network Connection Behaviors," 2013 International Conference on Cyber-Enabled Distributed Computing Knowledge Discovery, IEEE, Oct. 10, 2013, pp. 59-66.
"Using Whois Based Geolocation and Google Maps API for Support Cybercrime Investigations," http://wseas.us/e-library/conferences/2013/Dubrovnik/TELECIRC/TELECIRC-32.pdf.
Wiggerts, T.A., "Using Clustering Algorithms in Legacy Systems Remodularization," Reverse Engineering, Proceedings of the Fourth Working Conference, Netherlands, Oct. 6-8, 1997, IEEE Computer Soc., pp. 33-43.
Notice of Allowance for U.S. Appl. No. 14/616,080 dated Apr. 2, 2015.
Notice of Allowance for U.S. Appl. No. 14/486,991 dated May 1, 2015.
Notice of Allowance for U.S. Appl. No. 14/264,445 dated May 14, 2015.
Notice of Allowance for U.S. Appl. No. 14/139,713 dated Jun. 12, 2015.
Notice of Allowance for U.S. Appl. No. 14/139,628 dated Jun. 24, 2015.
Notice of Allowance for U.S. Appl. No. 14/139,640 dated Jun. 17, 2015.
Notice of Allowance for U.S. Appl. No. 14/473,552 dated Jul. 24, 2015.

(56) References Cited

OTHER PUBLICATIONS

Notice of Allowance for U.S. Appl. No. 14/278,963 dated Sep. 2, 2015.
Offical Communication for U.S. Appl. No. 14/473,552 dated Feb. 24, 2015.
Official Communication for U.S. Appl. No. 14/486,991 dated Mar. 10, 2015.
Official Communication for U.S. Appl. No. 14/264,445 dated Apr. 17, 2015.
Official Communication for U.S. Appl. No. 14/639,606 dated May 18, 2015.
Official Communication for U.S. Appl. No. 14/579,752 dated May 26, 2015.
Official Communication for U.S. Appl. No. 14/639,606 dated Jul. 24, 2015.
Official Communication for U.S. Appl. No. 14/579,752 dated Aug. 19, 2015.
Official Communication for U.S. Appl. No. 14/726,353 dated Sep. 10, 2015.
Official Communication for U.S. Appl. No. 14/251,485 dated Oct. 1, 2015.
Official Communication for U.S. Appl. No. 14/639,606 dated Oct. 16, 2015.
Official Communication for U.S. Appl. No. 14/579,752 dated Dec. 9, 2015.
Official Communication for U.S. Appl. No. 14/857,071 dated Mar. 2, 2016.
Official Communication for U.S. Appl. No. 14/581,920 dated Mar. 1, 2016.
Official Communication for U.S. Appl. No. 14/726,353 dated Mar. 1, 2016.
Official Communication for Great Britain Application No. 1404457.2 dated Aug. 14, 2014.
Official Communication for European Patent Application No. 14159535.5 dated May 22, 2014.
Official Communication for European Patent Application No. 15175171.8 dated Nov. 25, 2015.
Official Communication for European Patent Application No. 15180515.7 dated Dec. 14, 2015.
Restriction Requirement for U.S. Appl. No. 14/857,071 dated Dec. 11, 2015.
Notice of Allowance for U.S. Appl. No. 14/579,752 dated Apr. 4, 2016.
Keylines.com, "Visualizing Threats: Improved Cyber Security Through Network Visualization," Apr. 2014, <http://keylines.com/wp-content/uploads/2014/04/Visualizing-Threats1.pdf> downloaded May 12, 2014 in 10 pages.
Notice of Allowance for U.S. Appl. No. 14/323,935 dated Oct. 1, 2015.
Keylines.com, "An Introduction to KeyLines and Network Visualization," Mar. 2014, <http://keylines.com/wp-content/uploads/2014/03/KeyLines-White-Paper.pdf> downloaded May 12, 2014 in 8 pages.
Keylines.com, "KeyLines Datasheet," Mar. 2014, <http://keylines.com/wp-content/uploads/2014/03/KeyLines-datasheet.pdf> downloaded May 12, 2014 in 2 pages.
Official Communication for U.S. Appl. No. 14/639,606 dated Apr. 5, 2016.
Official Communication for Netherlands Patent Application No. 2012433 dated Mar. 11, 2016.
Li et al., "Identifying the Signs of Fraudulent Accounts using Data Mining Techniques," Computers in Human Behavior, vol. 28, No. 3, Jan. 16, 2012.
Ngai et al., "The Application of Data Mining Techniques in Financial Fraud Detection: A Classification Frameworok and an Academic Review of Literature," Decision Support Systems, Elsevier Science Publishers, Amsterdam, Netherlands, vol. 50, No. 3, Feb. 1, 2011.
Official Communication for European Patent Application No. 15193287.8 dated Apr. 1, 2016.
Official Communication for U.S. Appl. No. 14/581,920 dated May 3, 2016.
Official Communication for U.S. Appl. No. 15/072,174 dated Jun. 1, 2016.
Gu et al., "BotMiner: Clustering Analysis of Network Traffice for Protocol-and-Structure-Independent Botnet Detection," USENIX Security Symposium, 2008, 17 pages.
Official Communication for U.S. Appl. No. 14/698,432 dated Jun. 3, 2016.
Official Communication for U.S. Appl. No. 14/581,920 dated Jun. 13, 2016.
Official Communication for European Patent Application No. 15202090.5 dated May 13, 2016.
Quartert FS "Managing Business Performance and Detecting Outliers in Financial Services," Oct. 16, 2014, retrieved from https://quartetfs.com/images/pdf/white-papers/Quartet_FS_White_Paper_-_ActivePivot_Sentinel.pdf retrieved on May 3, 2016.
Quartert FS "Resource Center," Oct. 16, 2014, retrieved from https://web.archive.org/web/20141016044306/http://quartetfs.com/resource-center/white-papers retrieved May 3, 2016.
Hodge et al., "A Survey of Outlier Detection Methodologies," Artificial Intelligence Review, vol. 22, No. 2, Oct. 1, 2004.
Bhosale, Safal V., "Holy Grail of Outlier Detection Technique: A Macro Level Take on the State of the Art," International Journal of Computer Science & Information Technology, Aug. 1, 2014, retrieved from http://www.ijcsit.com/docs/Volume5/vol5issue04/ijcsit20140504226.pdf retrieved May 3, 2016.
Golmohammadi et al., "Data Mining Applications for Fraud Detection in Securities Market," Intelligence and Security Informatics Conference (EISIC), 2012 European, IEEE, Aug. 22, 2012, pp. 107-114.
Official Communication for European Patent Application No. 15201727.3 dated May 23, 2016.

\* cited by examiner

SYSTEMS AND METHODS FOR DETERMINING RELATIONSHIPS BETWEEN DEFECTS

FIELD OF THE INVENTION

This disclosure relates to approaches for identifying related defects associated with manufacturing or other processes.

BACKGROUND

Under conventional approaches, manufacturing process defects are periodically recorded. For example, hundreds, or even thousands, of defects may be recorded daily for a particular manufacturing process, such as the construction of cargo ships or other manufactured goods. Typically, defects are stored in a database which can be accessed by quality engineers or other users. However, existing technologies are insufficient to efficiently manage such large numbers of defects. As a result, defects are often improperly identified or handled, and root causes of defects are often never identified. Although defect information may be digitized and stored in databases, these databases lack sufficient rules-based systems for identifying relationships between defects and identifying larger process issues to which the identified defects may belong.

These and other drawbacks exist with conventional defect management systems.

SUMMARY

A claimed solution rooted in computer technology overcomes problems specifically arising in the realm of computer technology. The claimed solution may apply a rules-based solution to identifying and classifying relationships between defects so as to identify issues to which the defects relate. The system may rely on an unconventional rules-based method of determining relationships between identified manufacturing defects. The system may work with users to suggest defect issues and receive suggestions from users on defect issues. The system may implement an ongoing learning process to improve defect issue identification, based on user inputs.

According to the system, workers or engineers may identify defect items among manufactured, fabricated, and/or assembled products. The workers may record information about the defect items. The system may store the recorded information as defect data objects. The defect data objects may each be compared to one another to determine a relatedness level between them. According to the relatedness levels between and among many defect data objects, issues may be identified and analyzed. Issues may include many defect data objects, and may be representative of underlying problems within a manufacturing process. For example, similar defects in parts that all originate from the same machine tool may be grouped as an issue and indicate a deficiency or malfunction in that machine tool's process. Analysts may work with the defect items and associated issues, while the system may employ the relatedness information to suggest potential correlations between issues and defects.

Although systems and methods are described herein with reference to manufacturing processes, it will be appreciated that the described systems and methods may apply to other types of processes as well (e.g., industrial control processes).

In an implementation, a system for identifying relationships between defects is provided. The system may include one or more physical processors and a memory storing instructions. When executed by the one or more physical processors, the instructions may cause the computer system to obtain a first defect item, determine a set of respective distances between the first defect item and at least a portion of a set of second defect items, compare one or more respective distances of the set of respective distances to a relationship criteria, identify, based on the comparison, one or more of the second defect items as related to the first conformity item, and store an issue item comprising the first defect item and the related second defect items.

In another implementation, a method for identifying relationships between defects is provided. The method may be performed on a computer system having one or more physical processors programmed with computer program instructions. When executed by the one or more physical processors the instructions may cause the computer system to perform the method. The method may comprise obtaining, by the computer system, a first defect item, determining, by the computer system, a set of respective distances between the first defect item and at least a portion of a set of second defect item, comparing, by the computer system, one or more respective distances of the set of respective distances to a relationship criteria, identifying, by the computer system, based on the comparison, one or more of the second defect items as related to the first conformity item, storing, by the computer system, an issue item comprising the first defect item and the related second defect items.

In various implementations, a system may receive a first defect item, and compare it to a set of second defect items. For example, the first defect item can be a newly recorded defect, and the set of second defect items can be previously recorded defects. The system can determine a set of respective distances between the first defect item and at least a portion of the second set of defect items. For example, a pairwise distance may be calculated between the first defect item and each of the second defects recorded within a predetermined amount of time (e.g., within the last 24 hours). The system can compare the set of respective distances to a threshold distance, and determine which of the second defect items are related to the first defect item. In some implementations, at least a portion of the related defect items can be provided in response to a user request associated with the first defect item. For example, if a user views the first defect item, the system can recommend the user also view the related defect items.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the technology are utilized, and the accompanying drawings of which

DETAILED DESCRIPTION

The technology described herein relates to systems and methods for determining relationships between defects. In some implementations, a system may receive defect items including information about identified defects, and may store these as defect data objects in a defects database. The defect database may further store links between defect data objects, wherein a plurality of linked defect data objects may comprise a defect issue.

Example System Architecture

Figure 1:
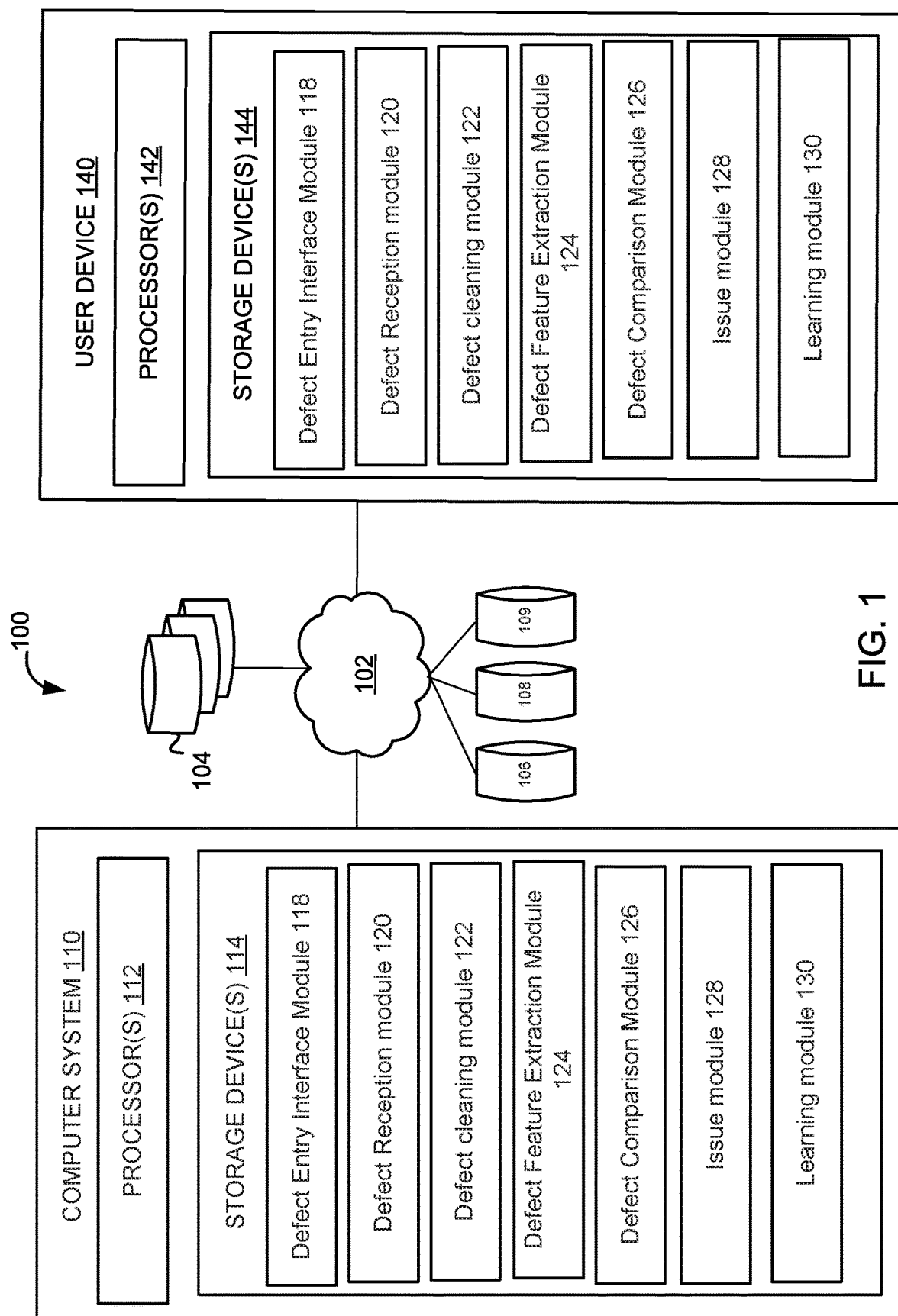
FIG. 1 depicts a system for determining relationships between defects, according to some implementations.

FIG. 1 depicts a system 100 for determining relationships between defects according to some implementations. In one implementation, system 100 may include a computer system 110, a user device 140, and a defect database 104, in communication via network 102, and/or other components. Defect database 104 is illustrated in FIG. 1 as separate from computer system 110 and user device 140. In some implementations, defect database 104 may be stored on the computer system 110, user device 140, or at a remote location.

Computer system 110 may be configured as a server (e.g., having one or more server blades, processors, etc.), a personal computer (e.g., a desktop computer, a laptop computer, etc.), a smartphone, a tablet computing device, and/or other device that can be programmed to receive defect data objects, analyze defect data objects, and determine relationships between defect data objects.

Figure 5:
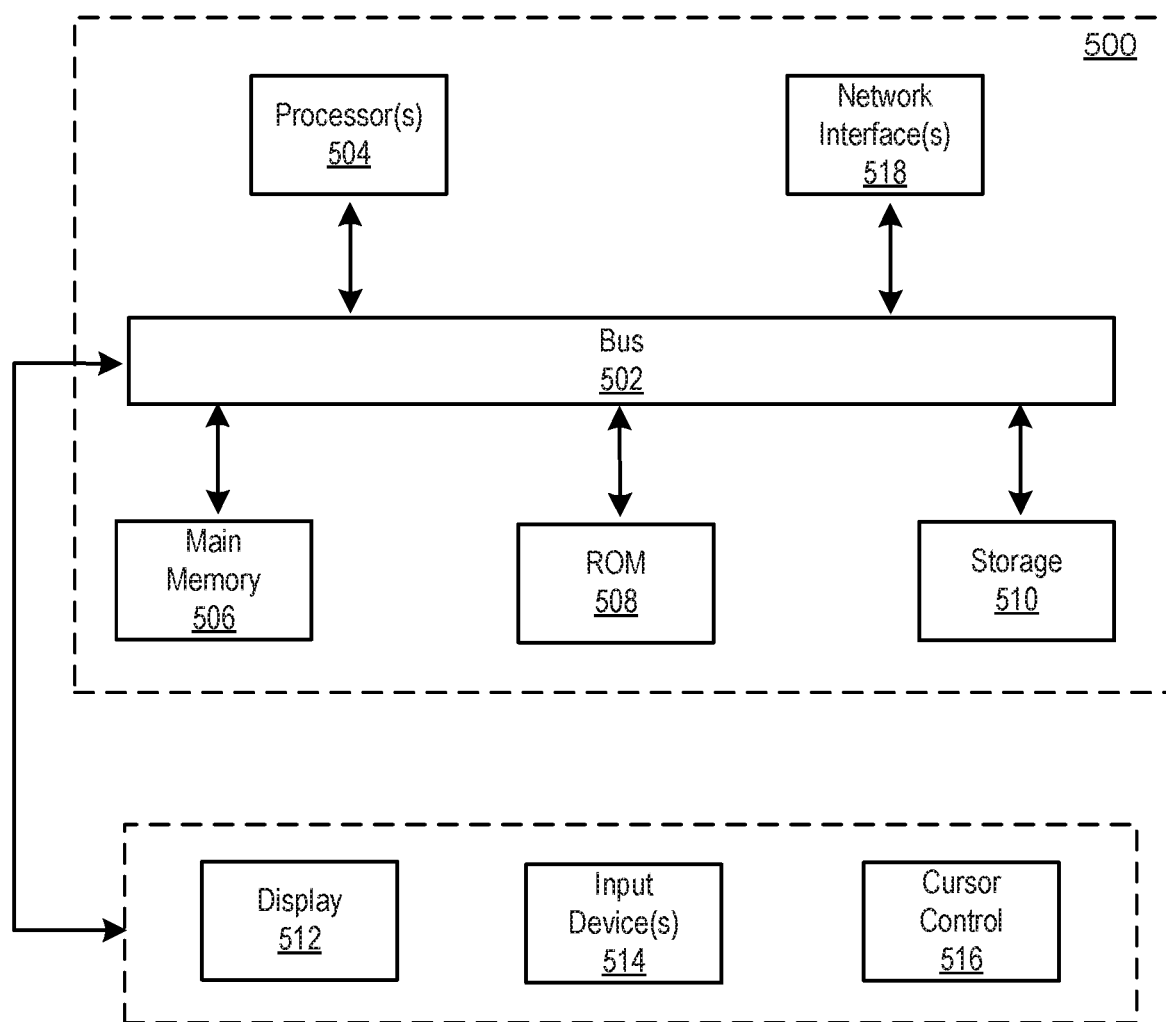
FIG. 5 depicts a block diagram of an example computer system in which any of the embodiments described herein may be implemented.

Computer system 110 may include one or more processors 112 (also interchangeably referred to herein as processors 112, processor(s) 112, or processor 112 for convenience), one or more storage devices 114, and/or other components. Processors 112 may be programmed by one or more computer program instructions stored on storage device 114. For example, processors 112 may be programmed by defect entry interface module 118, defect reception module 120, defect cleaning module 122, defect feature extraction module 124, defect comparison module 126, issue module 128, learning module 130, and/or other instructions that program computer system 110 to perform various operations, each of which are described in greater detail herein. As used herein, for convenience, the various instruction modules will be described as performing an operation, when, in fact, the various instructions program the processors 112 (and therefore computer system 110) to perform the operation. Further details and features of a computer system 110 configured for implementing features of the described technology may be understood with respect to computer system 500 as illustrated in FIG. 5.

User device 140 may be configured as a server device, a gaming console, a handheld gaming device, a personal computer (e.g., a desktop computer, a laptop computer, etc.), a smartphone, a tablet computing device, and/or other device that can be programmed to receive defect data objects, analyze defect data objects, and determine relationships between defect data objects.

User device 140 may include one or more processors 142 (also interchangeably referred to herein as processors 142, processor(s) 142, or processor 142 for convenience), one or more storage devices 144, and/or other components. Processors 142 may be programmed by one or more computer program instructions. For example, processors 142 may be programmed by defect entry interface module 118, defect reception module 120, defect cleaning module 122, defect feature extraction module 124, defect comparison module 126, issue module 128, and learning module 130, and/or other instructions that program computer system 110 to perform various operations, each of which are described in greater detail herein. As used herein, for convenience, the various instruction modules will be described as performing an operation, when, in fact, the various instructions program the processors 142 (and therefore user device 140) to perform the operation.

Various aspects of the defect identification and relationship determination system may operate on computer system 110 and/or on user device 140. That is, the various modules described herein may each operate on one or both of computer system 110 and/or user device 140. For example, in one implementation, a user device 140 comprising a smartphone may run defect entry interface module 118, permitting a technician or quality control engineer to enter information about identified defects into the user device 140. User device 140 may communicate with computer system 110 via network 102, and computer system 110 may receive the defect information via defect reception module 120 and perform various functions via defect cleaning module 122, defect feature extraction module 124, defect comparison module 126, issue module 128, and learning module 130. Other potential divisions of features between user device 140 and computer system 110 may be implemented without departing from the scope of the invention.

Defect entry interface module 118 may be a software module in operation on computer system 110 and/or on user device 140. Defect entry interface module 118 may include programming instruction that cause computer system 110 and/or user device 140 to provide to a user an interface for the input of defect items and the manipulation of defect item data sets.

Figure 2:
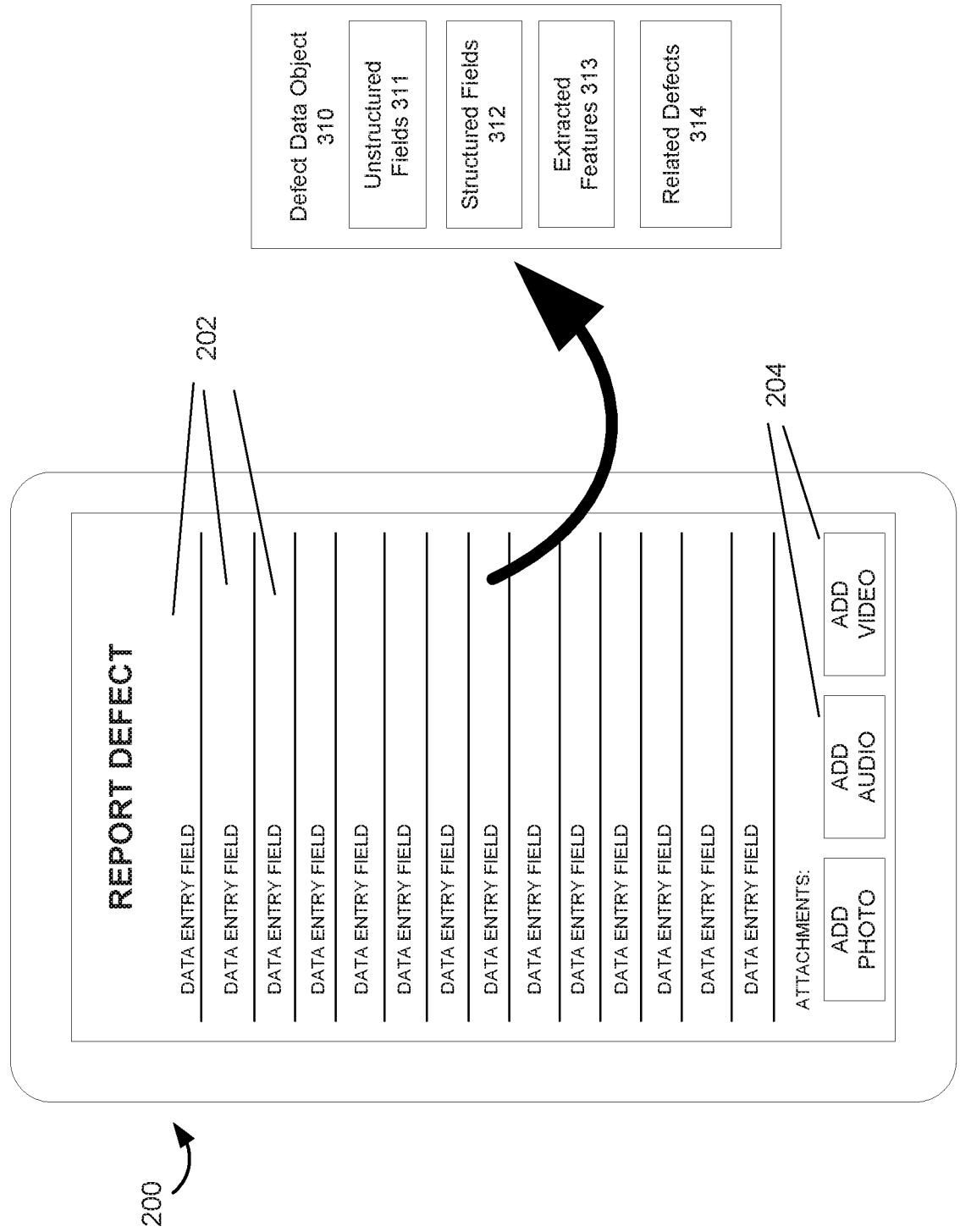
FIG. 2 depicts a defect entry system interface, according to some implementations.

FIG. 2 depicts an example defect entry interface 200 that may be implemented by defect entry interface module 118 for permitting a user to enter defect items. Defect entry interface 200 may include one or more data entry fields 202 and one or more attachment options 204. Data entry fields 202 may permit an operator to enter defect information. Attachment options 204 may permit an operator to add attachments to a defect item, including, for example, photos, audio, and video. Entered defect information may be stored as defect data objects 310, which may include structured fields 312, unstructured fields 311, extracted feature fields 313, and related defect fields 314. More detail regarding defect data objects 310 is provided below.

Defect items may refer to defects in manufactured and/or assembled items including deviations from specification(s), standard(s), expectation(s), and/or requirement(s) for a manufacturing process, such as for the construction of buildings, consumer items, vehicles, and/or other manufactured objects. Defect data objects may be entered into defect entry interface module 118 during and/or after detection of the defect items. For example, during an inspection of a manufacturing line/process for a consumer object, an engineer may detect a faulty component. The engineer may gather data about the faulty component/process (e.g., location of fault, type of fault, materials involved, description of fault, photo/video of fault, etc.). The gathered data may be received by defect entry interface module 118 after the inspection (e.g., the engineer inputs the data into a defect entry application running on a computer) or during the inspection (e.g., the engineer inputs the data into a defect entry application running on a mobile device).

As another example, the engineer may be running a defect entry application on a mobile device (e.g., phone, tablet). During the inspection of the manufacturing line/process, the engineer may detect and gather information about defect items. Using the defect entry application on the mobile device, the engineer may create new defect items and/or edit existing defect items. For individual defect items, the engineer may enter one or more information into different fields that identify different properties of the defect item. Such properties may include information about a manufacturing location, manufactured parts, assemblies, and sub-assemblies involved in the defect, the nature of the defect, defect measurements, workers responsible for the defect item, equipment involved in the production of the defective items, a time and date of manufacture, a time and date of defect discovery, photo, audio, video, and/or other any other relevant property of the defect item. Information about the defect items may be recorded as free text, using set codes/terms, and/or in multiple languages. Information about the defect items may be recorded periodically or non-periodically. The entered information may be added to a database running in a server when the mobile device/defect entry application syncs with the server. The syncing may be performed on a periodic basis, upon completion of entering information about a defect item, and/or based on manual command for syncing.

Returning now to FIG. 1, defect reception module 120 may be a software module operating on computer system 110. Defect reception module 120 may include programming instructions that cause computer system 110 to receive defect information and generate defect data objects 310. Defect information may be received from user device 140 and/or any other system in communication with computer system 110. Defect information may be entered via defect entry interface module 118 and communicated to defect reception module 120 and/or may be supplied to defect reception module via any other means.

Defect data objects 310 may be data objects including data fields to accommodate any and all information about a defect item as determined by engineer, including all of the information described above and any other information that may be relevant to a particular manufacturing process or manufacturing plant. In some implementations, defect data objects may store information in structured fields 312 and unstructured fields 311. Structured data fields 312 may be fields requiring a selection of one or more items from a predetermined list of items. For example, structured fields may include part or assembly numbers, manufacturing locations, defect codes, etc. Structured fields 312 may include any defect information that is selected from a predetermined list of potential entries. Unstructured fields 311 may include fields permitting a user to enter additional information about a defect without specific entry requirements. Unstructured data fields 311 may include, for example, free text fields, audio fields, video fields, and photo fields. Defect data objects 310 may further be configured to store data and/or information created during analysis of the defect data objects 310, e.g., in extracted features fields 313 and related defects fields 314, as discussed further below.

Defect reception module 120 may be configured to create defect data objects 310 upon receiving defect information. In some implementations, defect reception module may be configured to receive defect data objects 310 created by other software applications. In some implementations, defect reception module 120 may be configured to obtain defect data objects 310 stored in other locations, for example, external databases. Defect reception module 120 may be configured to access defect database 104 to store generated defect data objects 310.

Defect cleaning module 122 may be a software module in operation on computer system 110 and/or on user device 140. Defect cleaning module 122 may include programming instructions that cause computer system 110 and/or user device 140 to clean and/or filter defect data objects 310 stored in defect database 104. Defect cleaning module 122 may access a filter parameters data module 106 to determine criteria on which to filter stored defect data objects. Stored defect data objects 310 may be filtered based on any data field. For example, filtering may be implemented based on damage codes outside of a specific range, plant identifiers outside of a specific subset, manufacturer part numbers outside of a specific range, and/or any other data field of the defect data object. In some implementations, a defect data object 310 may include a binary filtering field, which may be set for filtering if any data fields within the defect data object meet the filtering criteria stored in the filter parameters data module 106. Accordingly, defect data objects may be excluded from further data analysis by setting of the binary filtering data field. In some implementations, defect cleaning module 122 may be configured to apply filtering parameters to all data stored in defect database 104. In some implementations, defect cleaning module 122 may be configured to apply filtering parameters only to newly introduced data, only to subsets of data, at specific times, and/or responsive to changes in filtering parameters. In some implementations, defect cleaning module 122 may be configured to filter out defect data objects 310 that include missing, incomplete, and/or erroneous data.

Defect feature extraction module 124 may be a software module in operation on computer system 110 and/or on user device 140. Defect feature extraction module 118 may include programming instruction that cause computer system 110 and/or user device 140 to extract feature information from data fields of defect data objects 310. Defect feature extraction module 124 may be configured to perform feature extraction steps on structured data fields 312 and unstructured data fields 311. Feature extraction may include an analysis of various data fields of the defect data objects 310 to generate additional information related to the defect data object 310. Newly generated information may be stored with the original defect data object 310, as additional extracted feature data fields 313, in a newly created data object, which may include only the extracted features, and/or in any other permanent or temporary data format that is suitable. Although the current discussion refers to extracted features being stored in the original defect data object 310, this is for example purposes only.

Defect feature extraction module 124 may perform feature extraction on structured features of stored defect data objects 310. Feature extraction on structured features of stored defect data objects 310 may include the extraction of a predetermined subset of specific data fields relevant to defect analysis. In some implementations, defect feature extraction module may implement a transform, translation, normalization, and/or other operation on a data field of defect data object in extracting a feature. For example, where a part has been given a new number, all versions of that part stored under the old part number may be updated to the new during a feature extraction step.

Defect feature extraction module 124 may perform feature extraction on unstructured feature fields 311 of stored defect data objects 310. Feature extraction on unstructured data fields 310 of defect data objects may include performing image analysis on image data, performing automatic speech recognition on audio data, performing both image analysis and automatic speech recognition on video data, and/or performing textual analysis on text data. Feature extraction on unstructured data may return feature analysis information capable of being compared to feature analysis information extracted from other features of a similar type.

In some implementations, defect feature extraction module 124 may perform feature extraction on textual information using a TF-IDF (term frequency-inverse document frequency) method, as follows. In some implementations, textual information may be translated to a common language prior to analysis. In some implementations, text may be analyzed without translation. In some implementations, text may be parsed via the use of various text parsing tools, including, for example, a stemmer tool configured to break words down into word stems. Stemming tools may be useful when performing word frequency analysis, as various forms of the same word may all be counted as the same word.

In some implementations, translation may include the use of a defect specific key-word dictionary. Engineering terms may not translate directly based on standard translation dictionaries. For example, due to language idiosyncrasies and usage patterns, the Chinese or Japanese description of a defect may not match the English description after translation. Accordingly, foreign language words for defect description may be specifically mapped to their translated equivalents by the defect specific key-word dictionary.

After initial text preparation, TF-IDF may proceed. Each word stem (or word, if stemming has not been performed), may have a TF-IDF score computed for it. The TF-IDF for each word stem may be computed by the equation $$tf-idf(t,d) = (\text{\# times term } t \text{ occurs in document } d) * \log\left(\frac{\text{\# documents}}{1 + (\text{\# documents containing term } t)}\right).$$

Thus, the formula multiplies the term frequency by the inverse document frequency. The term frequency is computed as the number of times the term t appears in the document d. The inverse document frequency is computed as the logarithm of the total number of documents divided by one plus the number of documents containing the term t. Terms that occur more frequently in all documents may have a low IDF, while rare terms may have a high IDF. As can be seen, the term inside the logarithm of the IDF calculation approaches one as the number of documents containing the term increases. Thus, the IDF approaches zero. Accordingly, for extremely common words such as 'the,' 'an,' etc., the TF-IDF score approaches zero. Thus, the TF-IDF method scores each word stem based on how frequently it appears in a document offset by how frequently it appears throughout other documents. The above TF-IDF equation is exemplary only, and methods of computing a term frequency-inverse document frequency may be employed without departing from the scope of the technology. For example, in some implementations, a TF-IDF computation may use the logarithm of the term frequency. In some implementations, the TF-IDF scores within a document may be normalized such that they sum to one.

As used by defect feature extraction module 124, the TF-IDF method may be performed on unstructured text fields (e.g., defect description) of defect data objects as documents. The documents to which each unstructured text field is compared may include unstructured text fields of all defect data objects 310 stored in defect database 104.

In some implementations, defect feature extraction module 124 may compute the IDF of one or more terms in the defect data objects stored in defect database 104 and store this information in association with defect database 104. IDF data may be stored for a predetermined number of terms, and may be filtered based on a document frequency of each term. Computing and storing IDF information of terms in defect database 104 may reduce a computational load during feature extraction. For example, when computing TF-IDF results for an defect data object 310 newly introduced to defect database 104, defect feature extraction module 124 may compute term frequencies for word stems in the new document and compare with the stored IDF values to compute TF-IDF values. Defect feature extraction module 124 may further update the stored IDF values when new data is introduced to defect database 104.

In some implementations, TF-IDF measurement may be performed on a predetermined number of terms defined by a defect vocabulary. A defect vocabulary may be established to contain words and/or word stems that have been found to be the most relevant terms in describing defects.

In some implementations, defect feature extraction module 124 may be configured to perform TF-IDF analysis on an audio data field after an automatic speech recognition process is performed on the audio data.

Defect comparison module 126 may be a software module in operation on computer system 110 and/or on user device 140. Defect comparison module 126 may include programming instructions that cause computer system 110 and/or user device 140 to compute comparison values between defect data objects in defect database 104. Defect comparison module 126 may compute comparison values between a first defect data object 310 and any number of other defect data objects 310 stored in the defect database 104. The results of these computations may be stored with defect data object 310 in related defect data fields 314, or in any other suitable data structure.

Computed comparison values may be stored as comparison sets, including at least the comparison value and an defect ID indicating the other defect that is being compared to the first defect. In some implementations, comparison data sets may include a comparison value and the two defect IDs between which the value is computed. Comparison sets may be stored in defect database 104 with the associated defect data object 310, and or in any other suitable data format. In some implementations, a predetermined number of comparison sets may be stored. In some implementations, the comparison sets having the highest scoring comparison values up to the predetermined number may be stored. In some implementations, an unlimited number of comparison sets may be stored. In some implementations, a predetermined threshold comparison value score may be used to determine which comparison sets are to be stored.

In some implementations, defect comparison module 126 may access a model parameter data module 108 to obtain parameters such as feature weights for computing comparison values.

In some implementations, comparison values between defect data objects 310 may be computed as pairwise distances, according to the following equation: $d(n_1, n_2) = a_0 * d_{TF\text{-}IDF}(n_1, n_2) + \Sigma_{i=1}^{N} a_i * (1-\delta(n_1[i], n_2[i]))$. In the pairwise distance equation, $a_0$, $a_1$, $a_2$, etc. correspond to feature weights. Thus, according to the equation, a pairwise distance between two defects $n_1$ and $n_2$ may be computed as a sum of weighted distances computed based on the unstructured fields 311 (e.g., $a_0 * d_{TF\text{-}IDF}(n_1, n_2)$, and weighted distances computed based on structured fields 312 (e.g., $\Sigma_{i=1}^{N} a_i * (1-\delta(n_1[i], n_2[i]))$).

The first term in the pairwise distance computation is a weighted distance between unstructured fields 311 of two defect data objects 310. A distance between unstructured fields 311 may be computed based on a comparison of TF-IDF scores of the unstructured fields of each defect data object. The distance computation may be weighted by a feature weight parameter ($a_0$) stored in model parameter data module 108. The distance computation may be based on a comparison between TF-IDF scores of the word stems of each defect data object 310. Where the word stems have less in common, a computed distance will be greater. An exemplary formula for computing the distance between TF-IDF scores may be as follows: $d_{TF\text{-}IDF}(n_1, n_2) = \Sigma_{w=1}^{v} a_w \sqrt{|n_{1,tf\text{-}idf(w)} - n_{2,tf\text{-}idf(w)}|}$ In the exemplary formula, $n_{1,tf\text{-}idf(w)}$ and $n_{2,tf\text{-}idf(w)}$ represent the tf-idf scores for two defects $n_1$ and $n_2$ for a particular word, w. The formula computes the sum, weighted by a factor $a_w$, of the square-roots of the absolute values of the differences in TF-IDF scores for each word of the vocabulary v, in common between two defects $n_1$ and $n_2$. The factor $a_w$ may differ for each word w. The provided formula is exemplary only, and other methods of computing distances between TF-IDF scores between two defects may be used without departing from the scope of the technology.

The second term in the pairwise distance computation includes a summation of weighted comparisons between one or more of the structured fields of two defect data objects. Each structured field that matches (i.e., $1-\delta(n_1[i], n_2[i])$ resolves to zero) between two defect data objects contributes zero to a distance summation. Each structured field that does not match contributes an amount equal to a corresponding feature weight to the distance summation. Thus, defect data objects 310 having a higher number of matches will have a lower distance between them.

Adding the unstructured distance term to the structured distance term yields a total pairwise distance between two defects. Lower distances indicate that two defects are more closely related.

As discussed above defect comparison module 126 may compute comparison values and generate comparison data sets for each defect data object 310 stored in defect database 104. In some implementations, the comparison data sets may be stored in, with, or in association with defect data objects 310 in defect database 104. In some implementations, defect data objects 310 including comparison data sets may be exported by defect comparison module 126 to issue library 109. Defect comparison module 126 may access issue library 109 to store comparison value information in the issue library 109. Defect comparison module 126 may further store any or all information associated with the defect data objects and/or defect data objects 310 in issue library 109.

In some implementations, defect comparison module 126 may be configured to reduce comparison value computation loads. Techniques for reducing computation loads may include reducing the number of defects between which comparison values are computed and prioritizing the calculation of terms based on feature weights. Reducing the number of defects between which comparison values are computed may be performed by computing comparison values only between defects that share certain criteria, e.g., input with a same time frame, an exact match on a specific field, etc.

In another implementation, data fields may be prioritized in a computation based on feature weights. For example, during a pairwise distance computation, terms with higher feature weights may be computed first. The summation in the pairwise distance calculation may be computed in an ongoing fashion, as each next data field is compared. When the distance calculation surpasses a predetermined threshold indicating no relationship, the computation of the distance between the two defects may be halted. For example, highly related defects share a plant very frequently, and thus a comparison between the plant data fields of defect data objects may be highly weighted. When computing distance between two defect data objects that do not share a plant, this computation may add significantly to the total distance between the defect data objects. By computing this term, and other terms that have the potential to add significantly to the total distance, first, defect comparison module 126 may reduce the total number of computations necessary because it may be determined that the two defect data objects are not related well before all data fields are compared.

Issue module 128 may be a software module in operation on computer system 110 and/or on user device 140. Issue module 128 may include programming instruction that cause computer system 110 and/or user device 140 to identify relationships between the stored defect data objects in issue library 109.

Defects may be grouped together as issues. Each issue may comprise one or more defects that are related to one another across one or more attributes. For example, a series of defects that identify a defect in the same part produced on the same machine may indicate a root cause of the defect to be from that machine. Issues may include significantly more complex relationships between defects than this, and defects of an issue may be related to one another by varying degrees across various attributes.

In computer system 110 and user device 140, defect data objects 310 may be grouped by issue data objects stored in issue library 109. Issue data objects may include all or a portion of the information of the defect data objects 310 that comprise them. In some implementations, issue data objects include data fields for defect IDs (which may point to the underlying defect data object), issue quality scores, and other relevant information. In some implementations, an issue quality score may be computed as a measure of connectedness of the weighted graph defined by the comparison values.

An issue quality score may be a measure of the relatedness of the defects encompassed by the issue. The issue quality score of an issue may include an aggregate measure of the comparison values between the defects of the issue. In some implementations, an issue quality score may be computed as an average of comparison values as calculated between each defect within the issue and each other defect within the issue. In some implementations, an issue quality score may be computed based on a ranking of comparison values of each defect within the issue.

In some implementations, computing an issue quality score based on a ranking of comparison values of each defect within an issue may be carried out as follows. As discussed above, each defect data object 310 may store an ordered list of the most highly related (e.g., smallest distance) other defect data objects 310. Some of the related defect data objects 310 may be grouped in an issue, and some may not be. For a specific defect data object 310 in the issue, a ranking of each other defect data object 310 in the issue according to its place on the specific defect data object's 310 ordered list may be determined. These rankings may be determined for each defect data object 310 within the issue. An issue quality score may be computed based on the comparison value rankings. For example, the issue quality score may be based on percentages of rankings falling within a specific range, e.g., 1-10, 11-20, 21-30, etc.

In another example, the issue quality score may be based on a probability that defects to be highly related to defects within the issue are also within the issue.

Issue module 128 may be configured to facilitate a user's interaction with determined issues. In some implementations, issue module 128 may be configured to suggest an issue from issue library 109 that may correspond to one or more defects selected by the user. In some implementations, issue module 128 may be configured to suggest one or more defects that may correspond to an issue selected by the user. In some implementations, issue module 128 may suggest that a new issue be created based on one or more selected defects.

Issue module 128 may be configured to suggest an issue from issue library 109 that may correspond to one or more defects selected by the user. A user may, through a user interface, review the data of one or more defect data objects 310. A user may select one or more defect data objects 310. Based on the user selection, issue module 128 may suggest a stored issue to which the user may wish to add the selected defect data objects 310. For example, an engineer may be reviewing a list of newly discovered defects. The engineer may note that several of the defects appear to have similar features and may further note that comparison value scores between the new defects indicate that they are highly related. The engineer may then seek to determine if the new defects should be added to an existing, known, issue. In response to the user's request to determine a known issue for the new defects, issue module 128 may suggest a potential matching issue. Issue module may suggest a potential matching issue according to the comparison value scores between the new defects and the defects of the potential matching issue. For example, issue module 128 may determine a temporary issue quality score for the issue if the new defects were to be added. If the temporary issue quality score represents an increase of the issue quality score based on the addition of the defect data objects 310, or does not decrease beyond a threshold, issue module 128 may suggest the issue as a potential match. Issue module 128 may suggest multiple issues, for example in a ranked list, according to the likelihood of their being matches.

In some implementations, issue module 128 may suggest that a new issue be created based on one or more selected defects. A user viewing a selected group of one or more defects may determine that the defects are related, and provide a request to the system to suggest an issue or additional defects that may correspond. In some implementations, issue module 128 may fail to determine a potentially matching issue. Issue module 128, responsive to a failure to determine a potentially matching issue, may suggest the creation of a new issue based on the selected defects. Issue module 128 may suggest additional defects as potentially related to the group of one or more defects by suggesting the defects having the best comparison value scores with respect to the group of one or more defects. In some implementations, all defects surpassing a predetermined threshold in the comparison value score may be suggested. In some implementations, a predetermined number of the highest rated defects based on comparison value scores may be suggested. Issue module 128 may generate a new issue data object based on the defect data objects corresponding to the selected defects.

In some implementations, issue module 128 may be configured to suggest one or more defects that may correspond to an issue selected by the user. A user may, through a user interface, review the data of one or more issue data objects. A user may select one or more issue data objects. Based on the user selection, issue module 128 may suggest on or more defect data objects which the user may wish to add to the selected issue data objects. For example, an engineer may be reviewing a known issue. The engineer may wish to know whether any newly discovered defects should be classified within that issue. In response to the user's request to determine one or more defects related to a selected issue, issue module 128 may suggest one or more potential matching defects. issue module 128 may suggest potential matching defects according to comparison value scores between defects of the selected issue and the new potential matching defects. For example, issue module 128 may determine a temporary issue quality score for the selected issue if the new defects were to be added. If the temporary issue quality score represents an increase of the issue quality score based on the addition of the defects, or does not decrease beyond a threshold, issue module 128 may suggest the defects as potential matches. Issue module 128 may suggest multiple defects, for example in a ranked list, according to the likelihood of matching.

Learning module 130 may be a software module in operation on computer system 110 and/or on user device 140. Learning module 130 may include programming instruction that cause computer system 110 and/or user device 140 to compute feature weights based on issue training data.

Learning module 130 may be configured to implement machine learning processes to determine appropriate feature weights as used by defect comparison module 126. As discussed above, relationships between pairs of defect data objects 310 may be computed as comparison values according to feature weights. Formulas for computing the comparison values may be weighted by feature weights stored in model parameter data module 108.

Stored feature weights may be established by learning module 130 based on training data. Training data may comprise a plurality of predetermined issue data objects, each including a plurality of defect data objects 310. Issue data objects may include a plurality of defect data objects 310, each of which may have a comparison value score with respect to each other defect data object within the issue data object. Machine learning techniques may be employed by learning module 130 based on the predetermined issue data objects to maximize the issue quality scores across the issue data objects by adjusting the feature weights.

As discussed above, each issue data object may include an issue quality score representing an aggregation of all the comparison value scores between its compositional defect data objects. Because the issue data objects in a training data set are known to be issues of related defects, as determined, for example, by a quality control engineer, their issue quality scores should be higher than groups of defects that do not form an issue. Learning module 130 may be configured to determine feature weights that maximize the aggregate issue quality scores for known issues across the training data. Maximizing the aggregate issue quality scores may include, for example, maximizing the average issue quality score while ensuring that all issue quality scores surpass a predetermined issue quality score threshold.

Learning module 130 may further be configured to update feature weights based on newly determined or modified issues. As discussed above, the system may afford a user the opportunity to determine new issues, add defects to existing issues, and remove defects from existing issues. Modification of issues through the creation or confirmation of new issues by a user and the addition of or removal of defects from existing issues by a user, may cause learning module 130 to update feature weights based on the modification. In some implementations, new system determinations of new issues as well as the addition of new defects into the system may also cause learning module 130 to update feature weights based on the new information. For example, in reviewing a series of defects, a user may determine that the grouping of defects is sufficiently related so as to constitute an issue. An issue quality score for the newly determined issue may be low, for example because the relationship between the series of defects may be based on a commonality in defect attributes were not heavily weighted in the current feature weighting system. learning module 130 may use the newly determined issue to update feature weights such that the newly determined issue has an issue quality score that surpasses a predetermined issue quality score threshold. In other examples, learning module may adjust and/or update feature weights as new defects are added to existing issues, as defects are removed from existing issues, and/or as entire issues are dissolved.

Although illustrated in FIG. 1 as a single component, computer system 110 and user device 140 may each include a plurality of individual components (e.g., computer devices) each programmed with at least some of the functions described herein. In this manner, some components of computer system 110 and/or user device 140 may perform some functions while other components may perform other functions, as would be appreciated. The one or more processors 112 may each include one or more physical processors that are programmed by computer program instructions. The various instructions described herein are exemplary only. Other configurations and numbers of instructions may be used, so long as the processor(s) 112 are programmed to perform the functions described herein.

Furthermore, it should be appreciated that although the various instructions are illustrated in FIG. 1 as being co-located within a single processing unit, in implementations in which processor(s) 112 includes multiple processing units, one or more instructions may be executed remotely from the other instructions.

Additionally, the modular software breakdown as illustrated in FIG. 1 is prepared for illustrative purposes only. The various instructions described with respect to specific software modules may be implemented by alternative software modules configured in different arrangements and with alternative function sets.

The description of the functionality provided by the different instructions described herein is for illustrative purposes, and is not intended to be limiting, as any of instructions may provide more or less functionality than is described. For example, one or more of the instructions may be eliminated, and some or all of its functionality may be provided by other ones of the instructions. As another example, processor(s) 112 may be programmed by one or more additional instructions that may perform some or all of the functionality attributed herein to one of the instructions.

The various instructions described herein may be stored in a storage device 114, which may comprise random access memory (RAM), read only memory (ROM), and/or other memory. The storage device may store the computer program instructions (e.g., the aforementioned instructions) to be executed by processor 112 as well as data that may be manipulated by processor 112. The storage device may comprise floppy disks, hard disks, optical disks, tapes, or other storage media for storing computer-executable instructions and/or data.

The various components illustrated in FIG. 1 may be coupled to at least one other component via a network 102, which may include any one or more of, for instance, the Internet, an intranet, a PAN (Personal Area Network), a LAN (Local Area Network), a WAN (Wide Area Network), a SAN (Storage Area Network), a MAN (Metropolitan Area Network), a wireless network, a cellular communications network, a Public Switched Telephone Network, and/or other network. In FIG. 1, as well as in other drawing Figures, different numbers of entities than those depicted may be used. Furthermore, according to various implementations, the components described herein may be implemented in hardware and/or software that configure hardware.

Defect database 104, issues library 109, filter parameters data module 106, and model parameters data module 108, described herein may be, include, or interface to, for example, an Oracle™ relational database sold commercially by Oracle Corporation. Other databases, such as Informix™, DB2 (Database 2) or other data storage, including file-based, or query formats, platforms, or resources such as OLAP (On Line Analytical Processing), SQL (Structured Query Language), a SAN (storage area network), Microsoft Access™ or others may also be used, incorporated, or accessed. The databases may comprise one or more such databases that reside in one or more physical devices and in one or more physical locations. The database may store a plurality of types of data and/or files and associated data or file descriptions, administrative information, or any other data.

Operation of computer system 110 and/or user device 140 according to the above described software modules may proceed as follows, with respect to FIG. 3.

Figure 3:
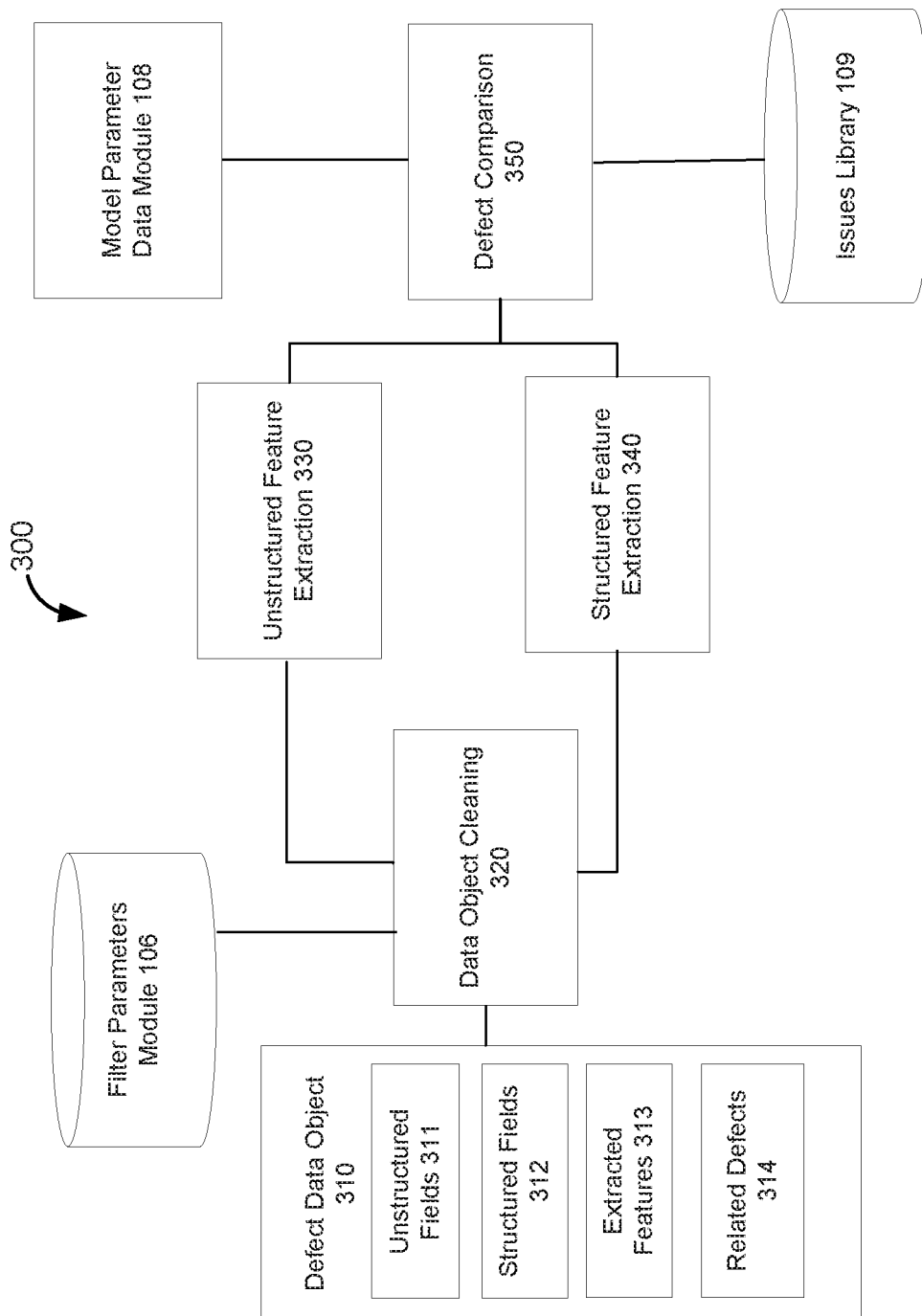
FIG. 3 depicts a process flow of a defect issue identification system, according to some implementations.

FIG. 3 depicts a process flow 300 of a defect issue identification system, according to some implementations.

As illustrated in FIG. 3, the system operates on defect data objects 310, which may include unstructured fields 311 and structured fields 312, as well as data collected during feature extraction in extracted features fields 313 and data collected during defect comparisons in a related defects field 314. As illustrated in FIG. 3, data fields 313 and 314 may be appended to or otherwise incorporated in to defect data objects 310. This depiction is exemplary only, and numerous other methods of storing this data may be implemented, including the creation of new data objects and/or the storage of this data in linked or otherwise associated objects.

Defect reception module 120 may receive defect information and generate defect data objects 310 to store the defect information in defect database 104. Defect reception module 120 may receive the defect information directly from a Defect entry interface module 118 and/or from any other source capable of transferring such data.

Defect cleaning module 122 may obtain defect data objects 310, for example by accessing defect database 104 and/or via defect reception module 120. Defect cleaning module 122 may perform an initial data object cleaning process 320 on defect data objects 310. Defect cleaning module 122 may access a filter parameters data module 106 to obtain filtering criteria. Filtering criteria may include rules for excluding defect data objects having specific attributes. Filtering criteria may include rules for cleaning data fields with out-of-bounds or otherwise erroneous data.

Cleaned defect data objects may then undergo feature extraction processes, both on structured data fields 312 in structured feature extraction process 340 and on unstructured data fields 311 in unstructured feature extraction process 330.

Unstructured feature extraction process 330 may be performed by defect feature extraction module 124. Unstructured features of defect data objects 310 may include any open-ended information fields, containing, for example, text, audio, video, and image data. Stored unstructured information may be analyzed to extract features of the unstructured data which may be compared to features of corresponding unstructured data fields of other defect data objects 310. In an implementation, defect feature extraction module 124 may perform a feature extraction process 330 on unstructured text fields of defect feature extraction module 124 using a TF-IDF scoring method, as described above. Defect feature extraction module 124 may generate an ordered list of scored terms from the unstructured text field, wherein the list is ordered according to TF-IDF scores. The ordered lists of scored terms may be stored in extracted feature data fields 313 of defect data objects 310.

Structured feature extraction process 340 may performed by defect feature extraction module 124. Structured feature extraction process 340 may include transform, translations, normalizations, and/or other operations on structured data fields 312 of defect data objects 310. Structured feature extraction processes 340 may further include the combination of multiple structured data fields 312. New data or features extracted during structured feature extraction process 340 may be stored in extracted features data fields 313.

Defect comparison process 350 may be performed by defect comparison module 126 on one or all data fields or extracted data fields of defect data objects 310. Defect comparison module 126 may access model parameter data module 108 to obtain feature weights to be applied during the defect comparison process 350. In a defect comparison process 350 defect data objects 310 each comparison field of a first defect data object 310 to be scored may be scored against one or more other defect data objects 310. Scoring may including a determination of comparison value scores between the first defect data object 310 being scored and all defect data objects 310 against which it is being scored. Scoring may be performed via various methods, including pairwise distance calculations as discussed above. Computed comparison value data sets may be stored in a related defects data field 314 of defect data objects 310. The related defects data field 314 may include one or more comparison value data sets, where each data set includes at least an identification number of a comparison defect and the comparison value score computed between the instant defect and the comparison defect.

Comparison value scores may be computed between all or some defects stored in defect database 104. In some implementations, obtained defect data objects 310 may be stored in groupings or buckets, according to a time, day, location, or other common criteria, that they were obtained. Defects may be scored against other defects within their grouping and against defects in a predetermined number of precursor or successive groups. For example, each defect in a first grouping may be scored against defects in five groupings received prior to the defects grouping and in five groupings received after the defect's grouping. The predetermined number of precursor and successive groupings may be modified according to system requirements.

Upon completion, of comparisons between defects, the modified defect data objects 310 may be stored in issue library 109. Issue library 109 may further include issue data objects configured to store issue data. Issue library 109 may be accessed via a user interface configured to facilitate a user's interaction with the stored defect data objects 310 and issue data objects.

Figure 4:
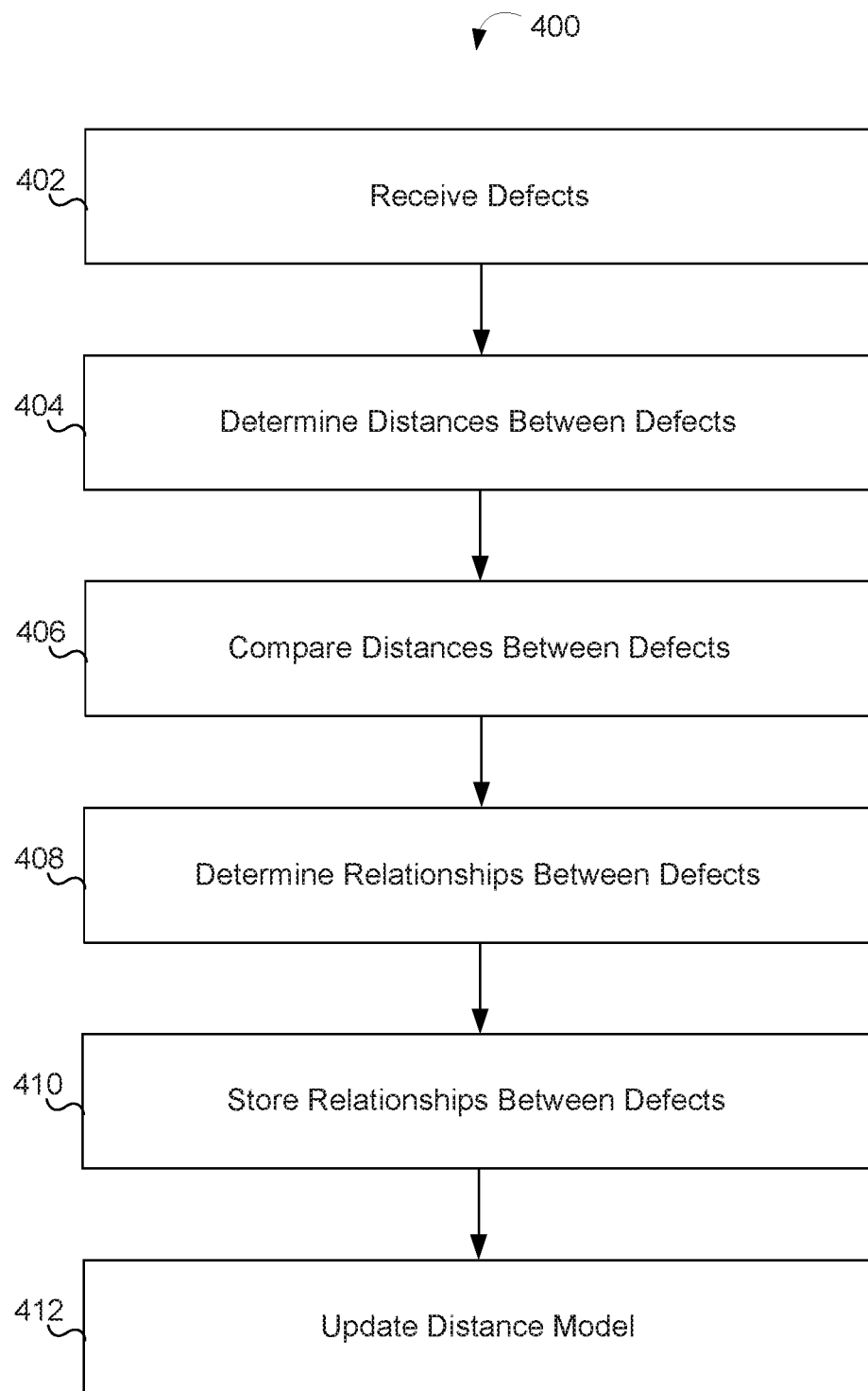
FIG. 4 depicts a process flow chart of a method for performing defect issue identification, according to some implementations.

FIG. 4 depicts a process 400 for identifying relationships between defects, according to some embodiments. The various processing operations and/or data flows depicted in FIG. 4 (and in the other drawing figures) are described in greater detail herein. The described operations may be accomplished using some or all of the system components described in detail above and, in some implementations, various operations may be performed in different sequences and various operations may be omitted. Additional operations may be performed along with some or all of the operations shown in the depicted flow diagrams. One or more operations may be performed simultaneously. Accordingly, the operations as illustrated (and described in greater detail below) are exemplary by nature and, as such, should not be viewed as limiting.

In an operation 402, process 400 may include obtaining one or more defect items. Defect items may be defined as defect data objects 310, and may be obtained by defect reception module 120. Defect reception module 120 may obtain defect information via a user interface provided by defect entry interface module 118 and generate one or more defect data objects 310 as a new defect data set according to the one information corresponding to the one or more defect items obtained.

In an operation 404, process 400 may include determining comparison values between defect items. Comparison value scores between defects may be determined based on a comparison value model. Comparison values between each of the defect data objects of the new defect data set obtained by defect reception module 120 and each other of the one or more defect data objects 310 of the new defect data set obtained by defect reception module 120 may be determined by defect comparison module 124. Comparison values between each of the one or more defect data objects 310 of the new defect data set and at least a portion of a set of previously stored defect data objects 310 may also be determined. Comparison value scores between a pair of defect data objects may be determined according to a comparison of one or more of corresponding data fields between the defect data objects 310. Each data field comparison may be weighted as part of the overall comparison value score according to stored feature parameter weights. The stored feature parameter weights may define the comparison value model. In some implementations, comparison values may include pairwise distances. Accordingly, the computer system 110 may determine, for each of the one or more defect data objects of the new defect data set, a set of respective distances between the defect data object and at least a portion of the other defect data objects of the one or more defect data objects of the new defect data set as well as at least a portion of a previously stored set of defect data objects 310.

In an operation 406, process 400 may include comparing the results of the comparison value determining to relationship criteria. In operation 406, issue module 128 may operate to perform the comparisons between stored comparison values and predetermined relationship criteria.

Predetermined relationship criteria may include, for example, predetermined threshold values for comparison with stored comparison values. For example, the comparison values of the one or more defect data objects 310 of the new defect data set may be compared to the threshold values to determine selected ones of the previously stored set of defect data objects that may be related to the one or more defect data objects of the new defect data set. That is, among the newly entered defect data objects 310, each of the stored defects that has a high comparison value score with the newly entered defect may be identified as a potentially related defects. In an implementation wherein pairwise distances are used as a comparison value score, then each defect having a distance below a predetermined distance threshold may be considered a potential match.

Predetermined relationship criteria may further include, for example, predetermined thresholds within an ordered list of comparison values. That is, for a newly entered defect data object 310, the most closely related defects may be determined as potential matches. The most closely related defects may include a predetermined number of defects as determined by a listing ranked by comparison value scores.

In an operation 408, issue module 128 may operate to identify relationships between defects according to comparisons performed in operation 406. Relationships may be identified between a first defect and a plurality of other defects, for example by selecting the plurality of other defects having comparison values with the first defect that exceed a predetermined threshold, or by selecting a predetermined number of other defects having the highest comparison values with the first defect. Relationships may be identified between a first defect and previously identified issues comprising multiple defects, for example by determining how the addition of the first defect to the each of the previously identified issues would affect the issue quality score. Relationships may be identified between a first identified issue and a plurality of other defects, for example by determining how each of the plurality of other defects would affect the issue quality score of the first identified issue.

In an operation 410, process 400 may include storing groups of defect data objects according to the identified relationships. Issue module 128 may operate to generate and store issue data objects based on groups of defect data objects selected during relationship identification operation 408. Issue module 128 may store an issue data object comprising defect data objects having relationships as identified during relationship identification operation 408.

Issue module 128 may further be configured to receive user input regarding the composition of an issue data object to be stored. For example, a selection of defect data objects 310 may be identified as related at operation 408. The selection may be presented to a user via a user interface for review. The user may determine to add defect data objects, subtract defect data objects, or otherwise modify the selection of defect data objects presented at operation 408.

Issue module 128 may be configured to generate and store issue data objects according to the systematically identified defect groupings of operation 408 and/or user input identifying relationships between defect data objects for storage as issue data objects.

In an operation 412, process 400 may include updating a comparison value score model. Machine learning techniques may be employed by learning module 130 to update the feature parameter weights of the comparison value score model according based on issue data objects stored at operation 410. Where a user has reviewed, approved, and optionally edited the defect composition of an issue data object before storage, the system may gain information about the relatedness of the defects composing the issue data object. That is, by approving a selection of defect data objects 310 for storage as an issue data object, a user may provide training data to a machine learning algorithm.

As discussed above, an issue data object may include an issue quality score indicating an aggregate level of relatedness among the defect data objects 310 forming the issue data object. A higher issue quality score may indicate a higher degree of relatedness. Approval of an issue data object by a user may provide an indication to learning module 310 that the issue data object may be used as training data. Accordingly, learning module 130 may determine to update the feature parameter weights of the comparison value score model so as to increase an issue quality score of the newly determined issue data object.

Thus, process 400 may operate to receive defect information and store the defect information as data objects. Process 400 may further operate to compare the stored information to identify relationships between defects and generate issues comprising multiple related defects. User selection and approval of issues may further be employed to update analysis models for more accurate defect relationship identification.

FIG. 5 depicts a block diagram of an example computer system 500 in which any of the embodiments described herein may be implemented. The computer system 500 includes a bus 502 or other communication mechanism for communicating information, one or more hardware processors 504 coupled with bus 502 for processing information. Hardware processor(s) 504 may be, for example, one or more general purpose microprocessors.

The computer system 500 also includes a main memory 506, such as a random access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 further includes a read only memory (ROM) 508 or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions.

The computer system 500 may be coupled via bus 502 to a display 512, such as a cathode ray tube (CRT) or LCD display (or touch screen), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules or computing device functionality described herein are preferably implemented as software modules, but may be represented in hardware or firmware. Generally, the modules described herein refer to logical modules that may be combined with other modules or divided into sub-modules despite their physical organization or storage.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 506. Such instructions may be read into main memory 506 from another storage medium, such as storage device 510. Execution of the sequences of instructions contained in main memory 506 causes processor(s) 504 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 510. Volatile media includes dynamic memory, such as main memory 506. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

The computer system 500 also includes a communication interface 518 coupled to bus 502. Communication interface 518 provides a two-way data communication coupling to one or more network links that are connected to one or more local networks. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN (or WAN component to communicated with a WAN). Wireless links may also be implemented. In any such implementation, communication interface 518 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 518, which carry the digital data to and from computer system 500, are example forms of transmission media.

The computer system 500 can send messages and receive data, including program code, through the network(s), network link and communication interface 518. In the Internet example, a server might transmit a requested code for an application program through the Internet, the ISP, the local network and the communication interface 518.

The received code may be executed by processor 504 as it is received, and/or stored in storage device 510, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

Engines, Components, and Logic

Certain embodiments are described herein as including logic or a number of components, engines, or mechanisms. Engines may constitute either software engines (e.g., code embodied on a machine-readable medium) or hardware engines. A "hardware engine" is a tangible unit capable of performing certain operations and may be configured or arranged in a certain physical manner. In various example embodiments, one or more computer systems (e.g., a standalone computer system, a client computer system, or a server computer system) or one or more hardware engines of a computer system (e.g., a processor or a group of processors) may be configured by software (e.g., an application or application portion) as a hardware engine that operates to perform certain operations as described herein.

In some embodiments, a hardware engine may be implemented mechanically, electronically, or any suitable combination thereof. For example, a hardware engine may include dedicated circuitry or logic that is permanently configured to perform certain operations. For example, a hardware engine may be a special-purpose processor, such as a Field-Programmable Gate Array (FPGA) or an Application Specific Integrated Circuit (ASIC). A hardware engine may also include programmable logic or circuitry that is temporarily configured by software to perform certain operations. For example, a hardware engine may include software executed by a general-purpose processor or other programmable processor. Once configured by such software, hardware engines become specific machines (or specific components of a machine) uniquely tailored to perform the configured functions and are no longer general-purpose processors. It will be appreciated that the decision to implement a hardware engine mechanically, in dedicated and permanently configured circuitry, or in temporarily configured circuitry (e.g., configured by software) may be driven by cost and time considerations.

Accordingly, the phrase "hardware engine" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented engine" refers to a hardware engine. Considering embodiments in which hardware engines are temporarily configured (e.g., programmed), each of the hardware engines need not be configured or instantiated at any one instance in time. For example, where a hardware engine comprises a general-purpose processor configured by software to become a special-purpose processor, the general-purpose processor may be configured as respectively different special-purpose processors (e.g., comprising different hardware engines) at different times. Software accordingly configures a particular processor or processors, for example, to constitute a particular hardware engine at one instance of time and to constitute a different hardware engine at a different instance of time.

Hardware engines can provide information to, and receive information from, other hardware engines. Accordingly, the described hardware engines may be regarded as being communicatively coupled. Where multiple hardware engines exist contemporaneously, communications may be achieved through signal transmission (e.g., over appropriate circuits and buses) between or among two or more of the hardware engines. In embodiments in which multiple hardware engines are configured or instantiated at different times, communications between such hardware engines may be achieved, for example, through the storage and retrieval of information in memory structures to which the multiple hardware engines have access. For example, one hardware engine may perform an operation and store the output of that operation in a memory device to which it is communicatively coupled. A further hardware engine may then, at a later time, access the memory device to retrieve and process the stored output. Hardware engines may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented engines that operate to perform one or more operations or functions described herein. As used herein, "processor-implemented engine" refers to a hardware engine implemented using one or more processors.

Similarly, the methods described herein may be at least partially processor-implemented, with a particular processor or processors being an example of hardware. For example, at least some of the operations of a method may be performed by one or more processors or processor-implemented engines. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)).

The performance of certain of the operations may be distributed among the processors, not only residing within a single machine, but deployed across a number of machines. In some example embodiments, the processors or processor-implemented engines may be located in a single geographic location (e.g., within a home environment, an office environment, or a server farm). In other example embodiments, the processors or processor-implemented engines may be distributed across a number of geographic locations.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will be appreciated that an "engine," "system," "data store," and/or "database" may comprise software, hardware, firmware, and/or circuitry. In one example, one or more software programs comprising instructions capable of being executable by a processor may perform one or more of the functions of the engines, data stores, databases, or systems described herein. In another example, circuitry may perform the same or similar functions. Alternative embodiments may comprise more, less, or functionally equivalent engines, systems, data stores, or databases, and still be within the scope of present embodiments. For example, the functionality of the various systems, engines, data stores, and/or databases may be combined or divided differently.

"Open source" software is defined herein to be source code that allows distribution as source code as well as compiled form, with a well-publicized and indexed means of obtaining the source, optionally with a license that allows modifications and derived works.

The data stores described herein may be any suitable structure (e.g., an active database, a relational database, a self-referential database, a table, a matrix, an array, a flat file, a documented-oriented storage system, a non-relational NoSQL system, and the like), and may be cloud-based or otherwise.

As used herein, the term "or" may be construed in either an inclusive or exclusive sense. Moreover, plural instances may be provided for resources, operations, or structures described herein as a single instance. Additionally, boundaries between various resources, operations, engines, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Although the invention has been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

Other implementations, uses and advantages of the invention will be apparent to those skilled in the art from consideration of the specification and practice of the invention disclosed herein. The specification should be considered exemplary only, and the scope of the invention is accordingly intended to be limited only by the following claims.

The invention claimed is:

1. A system comprising:
   one or more processors; and
   memory storing instructions that, when executed by the one or more processors, cause the system to:
   obtain a first defect data object stored in a database, the first defect data object including a first unstructured data field and a first structured data field;
   determine a set of respective pairwise distances between the first defect data object and at least a portion of a set of second defect data objects stored in the database, each of the second defect data objects of the at least a portion of the set of second defect data objects including a respective second unstructured data field and a respective second structured data field, a first term of the respective pairwise distances being based on a first weighted comparison between the first unstructured data field and the respective second unstructured data field, and a second term of the respective pairwise distances being based on a second weighted comparison between the first structured data field and the respective second structured data field;
   store the set of respective pairwise distances in the database;
   compare one or more respective pairwise distances of the set of respective pairwise distances stored in the database to a threshold pairwise distance;
   store one or more results of the comparison in the first defect data object stored in the database;
   identify, based on the one or more results of the comparison stored in the first defect data object stored in the database, one or more of the second defect data objects as being related to the first defect data object;
   store in the database an issue item comprising the first defect data object and the one or more related second defect data objects;
   receive a request to present the first defect data object;
   retrieve, based on the request to present the first defect data object, the issue item from the database; and
   present at least a portion of the one or more related second defect data objects in response to retrieving the issue item from the database.

2. The system of claim 1, wherein the second term of the respective pairwise distances is based on a summation of the second weighted comparison and one or more other weighted comparisons.

3. The system of claim 2, wherein one or more of the first and second weighted comparisons are weighted according to a set of model weight parameters.

4. The system of claim 3, wherein the system is further caused to:
   update the set of model weight parameters according to the modification of the issue item.

5. The system of claim 1, wherein the issue item is stored as an issue data object, and wherein to store the issue item the issue data object, the system is further caused to:
   compute an issue quality score of the issue according to the respective pairwise distances between the first defect data object and the related second defect data objects.

6. The system of claim 1, wherein the system is further caused to:
   receive, from the user, a modification of the issue item, wherein the modification includes an additional defect data object or the removal of a defect data object.

7. The system of claim 6, wherein to identify the one or more second defect items the system is further caused to:
   obtain a stored issue item comprising the related one or more of the second defect data objects; and
   to store the issue item the system is further caused to add the first defect data object to the stored issue item to generate the issue item.

8. The system of claim 1, wherein the system is further caused to:
   obtain a first issue item, the first issue item including the first defect item and a plurality of additional defect data objects;
   determine one or more additional sets of respective pairwise distances between the additional defects and a least a portion of the set of second defect data objects;
   compare the additional sets of respective pairwise distances to the threshold pairwise distance;
   identify, based on the comparison, one or more of the second defect data objects as related to the first issue item;
   store the issue item comprising the first defect data object, the additional defect data object, and the related second defect data objects.

9. A computer implemented method for rules-based identification of relationships between defects, the method being performed on a computer system having one or more physical processors programmed with computer program instructions that, when executed by the one or more physical processors, cause the computer system to perform the method, the method comprising:

obtaining, by the computer system, a first defect data object stored in a database, the first defect data object including a first unstructured data field and a first structured data field;

determining, by the computer system, a set of respective pairwise distances between the first defect data object and at least a portion of a set of second defect data objects stored in the database, each of the second defect data objects of the at least a portion of the set of second defect data objects including a respective second unstructured data field and a respective second structured data field, a first term of the respective pairwise distances being based on a first weighted comparison between the first unstructured data field and the respective second unstructured data field, and a second term of the respective pairwise distances being based on a second weighted comparison between the first structured data field and the respective second structured data field;

storing, by the computer system, the set of respective pairwise distances in the database;

comparing, by the computer system, one or more respective pairwise distances of the set of respective pairwise distances stored in the database to a threshold pairwise distance;

storing, by the computer system, one or more results of the comparison in the first defect data object stored in the database;

identifying, by the computer system, based on the one or more results of the comparison stored in the first defect data object stored in the database, one or more of the second defect data objects as being related to the first defect data object;

storing, by the computer system, an issue item in the database, the issue item comprising the first defect data object and the one or more related second defect data objects;

receiving, by the computer system, a request to present the first defect data object;

retrieving, by the computer system, based on the request to present the first defect data object, the issue item from the database; and presenting, by the computer system, at least a portion of the one or more related second defect data objects in response to retrieving the issue item from the database.

10. The method of claim 9, wherein the second term of the respective pairwise distances is based on a summation of the second weighted comparison and one or more other weighted comparisons.

11. The method of claim 10, wherein one or more of the first and second weighted comparisons are weighted according to a set of model weight parameters.

12. The method of claim 11, further comprising:
updating, by the computer system, the set of model weight parameters according to the modification of the issue item.

13. The method of claim 9, wherein the issue item is stored as an issue data object, and wherein storing the issue item further includes:
computing, by the computer system, an issue quality score of the issue according to the respective pairwise distances between the first defect data object and the related second defect data objects.

14. The method of claim 9, further comprising:
receiving, by the computer system, from the user, a modification of the issue item, wherein the modification includes an additional defect data object or the removal of a defect data object.

15. The method of claim 14, further comprising:
obtaining, by the computer system, a stored issue item comprising the related one or more of the second defect data objects; and
adding, by the computer system, the first defect data object to the stored issue item to generate the issue item.

16. The method of claim 9, further comprising:
obtaining, by the computer system, a first issue item, the first issue item including the first defect item and a plurality of additional defect data objects;
determining, by the computer system, one or more additional sets of respective pairwise distances between the additional defects and a least a portion of the set of second defect data objects;
comparing, by the computer system, the additional sets of respective pairwise distances to the threshold pairwise distance;
identifying, by the computer system, based on the comparison, one or more of the second defect data objects as related to the first issue item; and
storing, by the computer system, the issue item comprising the first defect data object, the additional defect data object, and the related second defect data objects.

17. A non-transitory computer readable medium comprising instructions that, when executed, cause one or more processors to perform a method, the method comprising:
obtaining a first defect data object stored in a database, the first defect data object including a first unstructured data field and a first structured data field;
determining a set of respective pairwise distances between the first defect data object and at least a portion of a set of second defect data objects stored in the database, each of the second defect data objects of the at least a portion of the set of second defect data objects including a respective second unstructured data field and a respective second structured data field, a first term of the respective pairwise distances being based on a first weighted comparison between the first unstructured data field and the respective second unstructured data field, and a second term of the respective pairwise distances being based on a second weighted comparison between the first structured data field and the respective second structured data field;
storing the set of respective pairwise distances in the database;
comparing one or more respective pairwise distances of the set of respective pairwise distances stored in the database to a threshold pairwise distance;
store one or more results of the comparison in the first defect data object stored in the database;
identifying, based on the comparison, one or more of the second defect data objects as related to the first defect data object;
store an issue item comprising the first defect data object and the one or more related second defect data objects;
receiving a request to present the first defect data object;
retrieving, based on the request to the present the first defect data object, the issue item from the database; and
presenting at least a portion of the one or more related second defect data objects in response to retrieving the issue item from the database.

* * * * *